United States Patent
Li et al.

(10) Patent No.: US 12,392,813 B2
(45) Date of Patent: Aug. 19, 2025

(54) ARC FAULT DETECTION CIRCUIT EMPLOYING A WINDOW GATING CIRCUIT

(71) Applicant: Chengli Li, Suzhou (CN)

(72) Inventors: Chengli Li, Suzhou (CN); Long Chen, Suzhou (CN); Guolan Yue, Suzhou (CN)

(73) Assignee: Chengli Li, Suzhou (CN)

( * ) Notice: Subject to any disclaimer, the term of this patent is extended or adjusted under 35 U.S.C. 154(b) by 216 days.

(21) Appl. No.: 18/348,161

(22) Filed: Jul. 6, 2023

(65) Prior Publication Data

US 2024/0410927 A1    Dec. 12, 2024

(30) Foreign Application Priority Data

Jun. 6, 2023   (CN) .......................... 202310662019.1
Jun. 6, 2023   (CN) .......................... 202321428692.0

(51) Int. Cl.
    *G01R 31/08* (2020.01)
(52) U.S. Cl.
    CPC .................................. *G01R 31/085* (2013.01)

(58) Field of Classification Search
    CPC ....... G01R 31/085; G01R 31/14; G01R 31/52
    See application file for complete search history.

(56) References Cited

U.S. PATENT DOCUMENTS 6,504,692 B1 *   1/2003   Macbeth ................. H02H 1/04
                                                    361/42
2006/0050450 A1 *  3/2006  Pellon ................ H02H 1/0015
                                                    361/42

* cited by examiner

*Primary Examiner* — Feba Pothen
(74) *Attorney, Agent, or Firm* — Chen Yoshimura LLP

(57) ABSTRACT

An arc fault detection circuit includes a signal collection circuit that collects a current signal on power supply lines and to output a first signal; a window gating circuit that generates a window gating signal corresponding to the first signal; and a signal processing circuit, coupled to the signal collection circuit and the window gating circuit, for generating an arc fault signal based on the window gating signal and the first signal. By using the window gating circuit, the arc fault detection circuit performs arc detection only during certain time intervals of the AC period where the harmful arcs will be present. This improves the accuracy of arc detection and reduces the probability of false tripping.

16 Claims, 6 Drawing Sheets

ARC FAULT DETECTION CIRCUIT EMPLOYING A WINDOW GATING CIRCUIT

BACKGROUND OF THE INVENTION

This invention relates to electrical safety protection, and in particular, it relates to an arc fault detection circuit that can more accurately detect arc faults.

In electrical wires and equipment for residential homes, due to long-term overload or loose electrical connection, the insulating cover layers of electrical wires can age, resulting in reduced insulating effectiveness, or the insulating cover layers may be damaged. These conditions may cause arc fault, and arcs may burn the wires and cause fire. According to the NEC (National Electrical Code), about 40% of residential fires are caused by arc fault.

With increased safety awareness, more and more homes are installed with arc fault circuit interrupters (AFCI). However, most existing arc fault circuit interrupters have a problem of inaccurate detection of harmful arcs, leading to false tripping that interrupt the electrical supply and causing inconvenience for the users.

SUMMARY OF THE INVENTION

To solve the above problems, the present invention is directed to an arc fault detection circuit that can accurately detect arc faults in power supply wires and to break the circuit in response.

To achieve the above objects, the present invention provides an arc fault detection circuit, which includes: a signal collection circuit, configured to collect a current signal on the power supply lines and to output a first signal; a window gating circuit, configured to generate a window gating signal corresponding to the first signal, wherein the window gating signal is at a first voltage level during one or more first time intervals within each period of an AC (alternating current) signal on the power supply lines, and at a second voltage level during remaining time intervals of each period of the AC signal; and a signal processing circuit, coupled to the signal collection circuit and the window gating circuit, configured to generate an arc fault signal in response to the window gating signal and the first signal, wherein the signal processing circuit is configured to block the first signal during the one or more first time intervals of each period and to generate the arc fault signal based on the first signal during the remaining time intervals of each period.

By employing the window gating circuit, the arc fault detection circuit performs arc detection only during certain time intervals where harmful arcs (those that can cause fire) will certainly appear—i.e., if insulation defects exist and cause arcs, then the characteristic wave forms of arcs will certainly appear in these time intervals, even though they may also appear in other time intervals. In certain other time intervals, characteristic wave forms similar to arcs but are not actually caused by arcs may be present due to other factors such as the nature of the load. Therefore, by performing arc detection only in the time intervals where the characteristic wave forms of arcs will certainly appear (if arc fault is present), and not performing arc detection in the other time intervals where other similar wave forms are present, arc detection accuracy is greatly improved, and false tripping is reduced. This achieves reliable arc detection while solving the false tripping problem.

In some embodiments, the signal processing circuit includes a characteristics extraction sub-circuit, configured to extract arc characteristics from the first signal to generate an arc characteristics signal.

In some embodiments, the signal processing circuit includes: a signal amplifying sub-circuit, configured to amplify the first signal to generate a second signal; and a characteristics extraction sub-circuit, coupled to the signal amplifying sub-circuit, configured to extract arc characteristics from the second signal to generate an arc characteristics signal.

In some embodiments, the signal processing circuit further includes a drive pulse generating sub-circuit, coupled to the characteristics extraction sub-circuit, configured to generate an arc pulse signal based on the arc characteristics signal.

In some embodiments, the signal processing circuit further includes a pulse counting sub-circuit, coupled to the drive pulse generating sub-circuit, configured to count a number of pulses in the arc pulse signal and to generate the arc fault signal based on the number of pulses within a defined length of time.

In some embodiments, the window gating circuit includes: a first voltage divider sub-circuit, coupled to the power supply lines, configured to divide a voltage on the power supply lines to generate a first voltage signal; a second voltage divider sub-circuit, coupled to the power supply lines, configured to divide the voltage on the power supply lines to generate a second voltage signal; and a gating sub-circuit, having an input coupled to the first voltage generated by the first voltage divider sub-circuit, and an output coupled to the second voltage generated by the second voltage divider sub-circuit, wherein the gating sub-circuit is configured to become conductive in response to the first voltage at its input being within a predefined range, and to be non-conductive otherwise, to generate the window gating signal.

In some embodiments, the gating sub-circuit includes a first voltage regulator, a first transistor, a second transistor, a first protection resistor and a second protection resistor, wherein a first end of the first voltage regulator is an input of the gating sub-circuit, a second end of the first voltage regulator is coupled to a first terminal of the first transistor, a second terminal of the first transistor is coupled to ground, a third terminal of the first transistor is coupled to a first terminal of the second transistor via the first protective resistor, a first terminal of the second transistor is coupled to a first end of the second protective resistor, a second end of the second protective resistor is coupled to a second terminal of the second transistor and to a voltage source, and a third terminal of the second transistor is an output of the gating sub-circuit.

In some embodiments, the gating sub-circuit includes a three-terminal adjustable voltage regulator, a second transistor, a first protective resistor and a second protective resistor, wherein a first terminal of the three-terminal adjustable voltage regulator is an input of the gating sub-circuit, a second terminal of the three-terminal adjustable voltage regulator is coupled to ground, a third terminal of the three-terminal adjustable voltage regulator is coupled to a first terminal of the second transistor via the first protective resistor, the first terminal of the second transistor is coupled to a first end of the second protective resistor, a second end of the second protective resistor is coupled to a second terminal of the second transistor and a voltage source, and a third end of the second transistor is an output of the gating sub-circuit.

In some embodiments, the gating sub-circuit includes a first comparator, a first voltage divider resistor, a second voltage divider resistor, and a diode, wherein a non-inverting input terminal of the first comparator is an input of the gating sub-circuit, an inverting input terminal of the first comparator is coupled to the first voltage divider resistor and the second voltage divider resistor, another end of the first voltage divider resistor is coupled to a voltage source, another end of the second voltage divider resistor is coupled to ground, an output terminal of the first comparator is coupled to an anode of the diode, and a cathode of the diode is an output of the gating sub-circuit.

In some embodiments, the arc fault detection circuit further includes: an arc fault drive circuit, coupled to the signal processing circuit, configured to generate a switch control signal based on the arc fault signal; and a switch circuit, couple to the arc fault drive circuit, configured to open or close an on/off switch on the power supply lines based on the switch control signal.

In some embodiments, the arc fault detection circuit further includes a simulated arc test circuit, having an output coupled to the signal collection circuit or the signal processing circuit, configured to generate a simulated arc fault signal, wherein the signal processing circuit processes the simulated arc fault signal to generate an arc fault signal, whereby the switch circuit opens the on/off switch on the power supply line in response to the simulated arc fault signal.

In some embodiments, the arc fault detection circuit further includes a power supply circuit, which includes a rectifier configured to convert an AC current from the power supply line to a DC current, and a second voltage regulator configured to generate a stable DC voltage to supply the window gating circuit and the signal processing circuit.

In some embodiments, the signal processing circuit further includes a filtering sub-circuit, coupled to the signal collection circuit, configured to filter the first signal.

In some embodiments, the signal processing circuit includes a filtering sub-circuit, a characteristics extraction sub-circuit, and a drive pulse generating sub-circuit, wherein the window gating circuit is electrically coupled to at least one of the signal collection circuit, the filtering sub-circuit, the characteristics extraction sub-circuit, and the drive pulse generating sub-circuit, configured to block the output signal of the signal collection circuit, the filtering sub-circuit, the characteristics extraction sub-circuit, or the drive pulse generating sub-circuit during the one or more first time intervals.

BRIEF DESCRIPTION OF DRAWINGS

Embodiments of the present invention are described with reference to the following drawings. Other objectives, details, features, and advantages of the embodiments will also become clearer from the detailed descriptions.

DETAILED DESCRIPTION OF THE INVENTION

Embodiments of the present invention are described below with reference to the drawings. In the embodiments, many details are described for a full understanding of the invention. However, those skilled in the relevant art will readily recognize that some of the described features may be omitted in certain situations or replaced by other components, materials or methods. In some situations, certain operational aspects of the embodiments may not be expressly shown or described in this disclosure; for those skilled in the relevant art, such descriptions are not necessary, and the operations mat be readily understood based on the descriptions of the structures and common knowledge in the field.

In this disclosure, ordinal numbers such as first, second, etc. are only used to distinguish the objects being described, and do not connote a temporal or spatial sequence or a particular number of parts. Further, terms such as connect, coupled, link, etc. refer to either direct or indirect connections, unless otherwise indicated.

Figure 1:
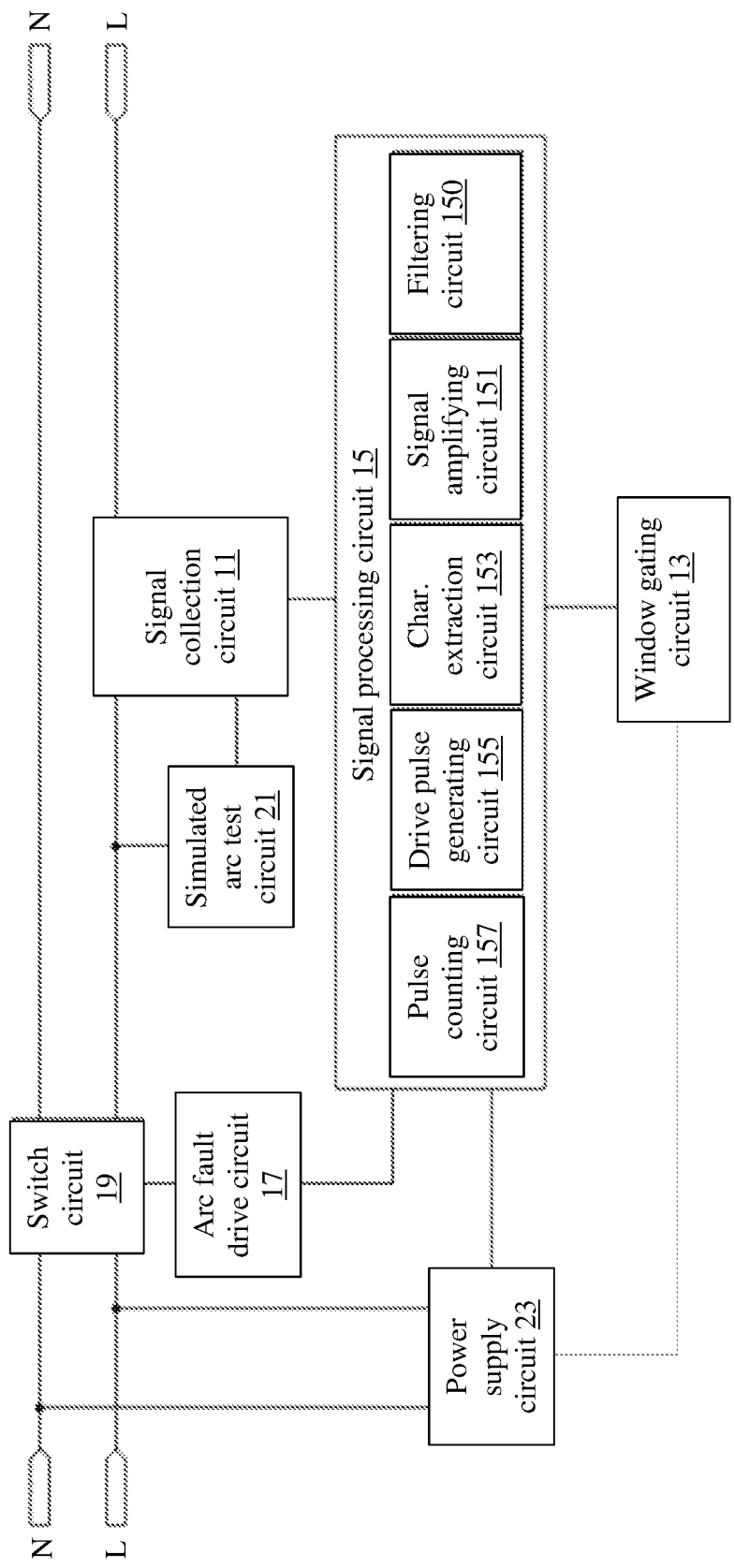
FIG. 1 is a system block diagram illustrating an arc fault detection circuit according to an embodiment of the present invention.

FIG. 1 is a system block diagram illustrating an arc fault detection circuit according to an embodiment of the present invention. The arc fault detection circuit includes: a signal collection circuit 11, a window gating circuit 13, and a signal processing circuit 15. The signal collection circuit 11 collects the current signal on the power supply lines (e.g., the hot line L and white line N in FIG. 1), and outputs a first signal. The window gating circuit 13 outputs a window gating signal corresponding to the first signal; the window gating signal functions to allow the signal processing circuit 15 to block out the first signal during one or more predefined time intervals in each period of the AC (alternating current) power supply current (referred to as blocked time intervals for convenience), and process the first signal during one or more time intervals of each period where arcs are more likely to occur (referred to as arc detection time intervals, or non-blocked time intervals, for convenience). The window gating signal is at a high level during one or more time intervals of each period of the AC current, and at a low level during the rest of the period. The signal processing circuit 15 is coupled to the signal collection circuit 11 and the window gating circuit 13, and operates to generate an arc fault signal based on the window gating signal and the first signal.

In some embodiments, the signal processing circuit 15 includes a filtering sub-circuit 150, a signal amplifying sub-circuit 151, a characteristics extraction sub-circuit 153, a drive pulse generating sub-circuit 155, and a pulse counting sub-circuit 157. The filtering sub-circuit 150 is coupled to the signal collection circuit 11, and operates to filter the first signal and output the filtered signal (i.e. it outputs a characteristic current signal during the arc detection time intervals). The signal amplifying sub-circuit 151 amplifies the filtered first signal to generate a second signal. The characteristics extraction sub-circuit 153 is coupled to the signal amplifying sub-circuit 151, and operates to extract arc characteristics from the second signal to generate an arc characteristics signal. The drive pulse generating sub-circuit 155 is coupled to the characteristics extraction sub-circuit 153, and operates to generate an arc pulse signal based on the arc characteristics signal (i.e. it converts the arc characteristics signal to the arc pulse signal which has a certain duty cycle). The pulse counting sub-circuit 157 is coupled to the drive pulse generating sub-circuit 155, and operates to count and record the number of pulses in the arc pulse signal, and further to generate the arc fault signal based on the number of pulses within a defined length of time. By amplifying the first signal using the signal amplifying sub-circuit 151, the accuracy of arc fault detection is enhanced. In some other embodiments, the signal processing circuit 15 may omit the signal amplifying sub-circuit 151, which can simplify the circuit and lower cost.

In some embodiments, the arc fault detection circuit further includes an arc fault drive circuit 17 and a switch circuit 19. The arc fault drive circuit 17 is coupled to the signal processing circuit 15, and operates to generate a switch control signal based on the arc fault signal. The switch circuit 19 is couple to the arc fault drive circuit 17, and operates to open or close an on/off switch on the power supply lines.

In some embodiments, the arc fault detection circuit further includes a simulated arc test circuit 21, which has its output coupled to the signal collection circuit 11 or the signal processing circuit 15. The simulated arc test circuit 21 operates to generate a simulated arc fault signal, which is processed by the signal processing circuit 15 to generate an arc fault signal, so that the switch circuit 19 opens the switch on the power supply line in response to the simulated arc fault signal. Using the simulated arc test circuit 21 to generate a simulated arc fault allows testing (e.g. manual testing) of the proper operation of the arc fault detection circuit.

In some embodiment, the arc fault detection circuit further includes a power supply circuit 23, which operates to rectify and voltage-regulate the voltage on the power supply lines so as to supply the window gating circuit 13 and signal processing circuit 15 with a DC power. The power supply circuit 23 is coupled to the power supply lines; it employs a rectifier to convert the AC current from the power supply line to DC current, and a voltage regulator to generate a stable DC voltage to supply the signal processing circuit 15 and window gating circuit 13.

Figure 2:
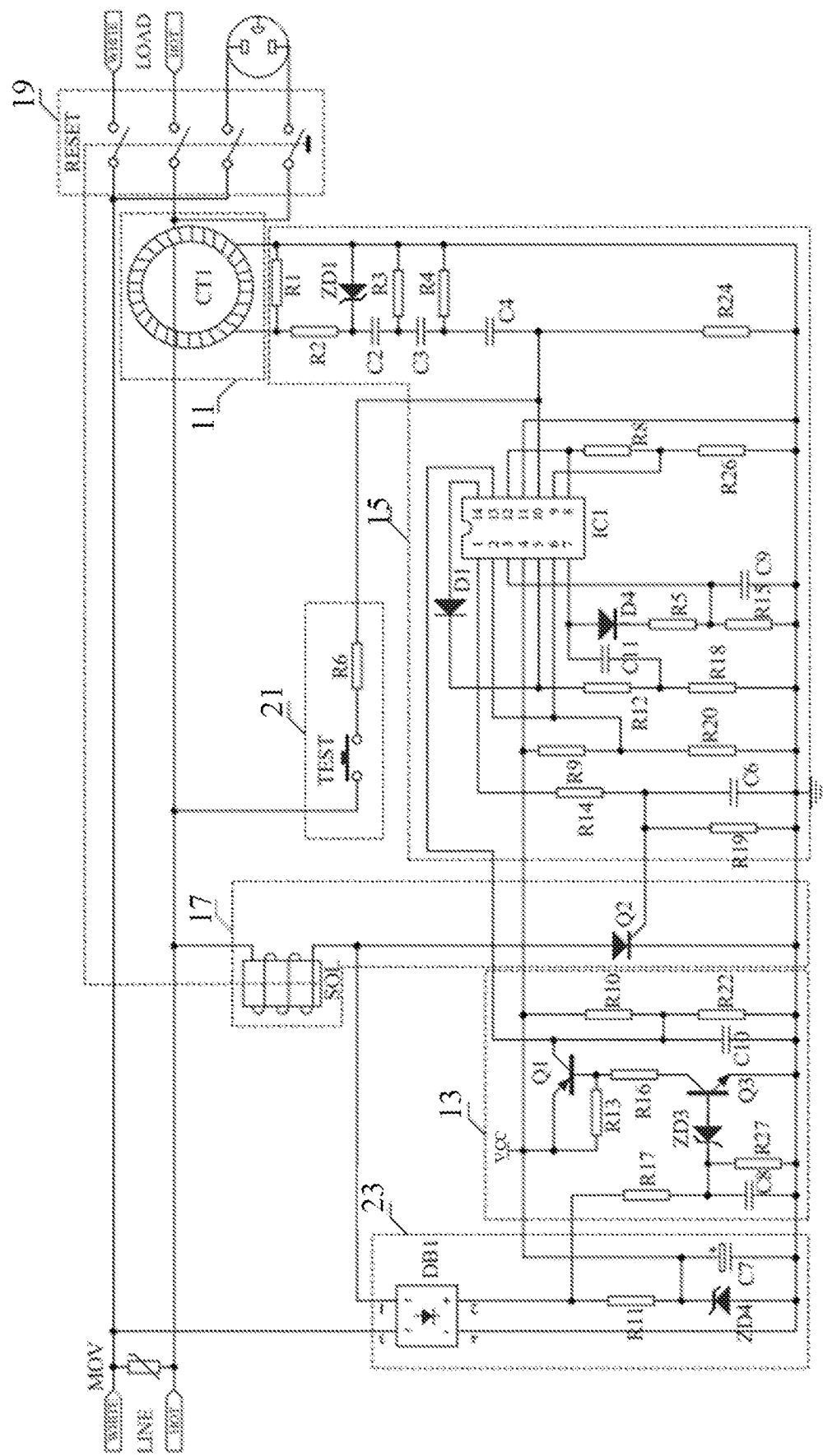
FIG. 2 is a circuit diagram illustrating the arc fault detection circuit according to an embodiment of the present invention.

In some embodiment, the window gating circuit 13 is coupled to at least one of the signal collection circuit 11, the filtering sub-circuit 150, the characteristics extraction sub-circuit 153 and the drive pulse generating sub-circuit 155, and operates to block the output signals of the above circuits during the predefined time intervals (the blocked time intervals) in each AC period. In other words, the window gating circuit 13 allows one or more of these processing stages on the signal processing path to process signals that contain arc characteristics, by blocking the current signal during the blocked time intervals, and keeping the characteristic current signal during the arc detection time intervals (non-blocked time intervals). This enhances the accuracy of arc detection. FIG. 2 is a circuit diagram illustrating the arc fault detection circuit according to an embodiment of the present invention. The structure of the arc fault detection circuit is described below with reference to FIG. 2.

In some embodiments, the signal collection circuit 11 includes a current transformer CT1, which collects a current on the power supply lines and outputs the first signal, i.e., the current signal of the power supply lines.

In some embodiments, the filtering sub-circuit 150 includes resistors R1, R2, R3, R4, and R24, capacitors C2, C3, and C4, and a voltage regulator (Zener diode) ZD1. The resistor R1 is coupled in parallel with the secondary winding of the current transformer CT1, to convert the current signal output by the secondary winding of the current transformer CT1 to a voltage signal (the secondary voltage signal). The voltage signal is filtered by the circuit formed by R2, R3, R4, C2, C3 and C4, so that a voltage signal in the frequency range of the arcs is preserved. The Zener diode ZD1 regulates the voltage of the filtered voltage signal. In this circuit, a first end of resistor R1 is coupled to a first end of resistor R2; a second end of resistor R1 is coupled to the cathode of the Zener diode ZD1; the anode of the Zener diode ZD1 is coupled to a second end of resistor R2 and a first end of capacitor C2; a second end of capacitor C2 is coupled a first end of resistor R3 and a first end of capacitor C3; a second end of capacitor C3 is coupled to a first end of resistor R4 and a first end of capacitor C4; a second end of capacitor C4 is coupled to ground via resistor R24; second ends of resistors R3 and R4 are coupled to the cathode of Zener diode ZD1 and to ground. The second end of capacitor C4 is the output of the filtering sub-circuit 150.

In some embodiments, the window gating circuit 13 includes a first voltage divider sub-circuit, a second voltage divider sub-circuit, and a gating sub-circuit. The first voltage divider sub-circuit is formed by serial coupled resistors R17 and R27, and the second voltage divider sub-circuit is formed by serial coupled resistors R10 and R22. The coupling point between resistors R17 and R27 is the output of the first voltage divider sub-circuit, which outputs a first voltage signal. The coupling point between resistors R10 and R22 is the output of the second voltage divider sub-circuit, which outputs a second voltage signal.

In some embodiments, the gating sub-circuit includes a voltage regulator (Zener diode) ZD3, a first transistor Q3, a second transistor Q1, a first protection resistor R16 and a second protection resistor R13. A first end of Zener diode ZD3 is the input of the gating sub-circuit; a second end of Zener diode ZD3 is coupled to a first terminal of the first transistor Q3; a second terminal of the first transistor Q3 is coupled to ground; a third terminal of the first transistor Q3 is coupled to a first terminal of the second transistor Q1 via the first protective resistor R16; a first terminal of the second transistor Q1 is coupled to a first end of the second protective resistor R13; a second end of the second protective resistor R13 is coupled to a second terminal of the second transistor Q1 and to a voltage source Vcc. A third terminal of the second transistor Q1 is the output of the gating sub-circuit.

In some embodiments, the first transistor Q3 is an NPN type bipolar transistor (its first terminal being the base, the second terminal being the emitter, and the third terminal being the base); the second transistor Q1 is a PNP type bipolar transistor (its first terminal being the base, the second terminal being the emitter, and the third terminal being the collector). In some other embodiments, the first and second transistors Q3 and Q1 may be field-effect transistors.

In some embodiments, the window gating circuit 13 may further include filtering capacitors C8 and C10. Capacitor C8 is coupled in parallel with the voltage division resistor R27, and capacitor C10 is coupled in parallel with the voltage division resistor R22. This filtering processing may enhance the gating effect of the window gating signal. Preferably, capacitor C8 is a phase shift capacitor; by adjusting the phase of the voltage signal inputted to the window gating circuit 13 from the rectifier DB1, the gating accuracy of the window gating circuit 13 may be improved.

Figure 3:
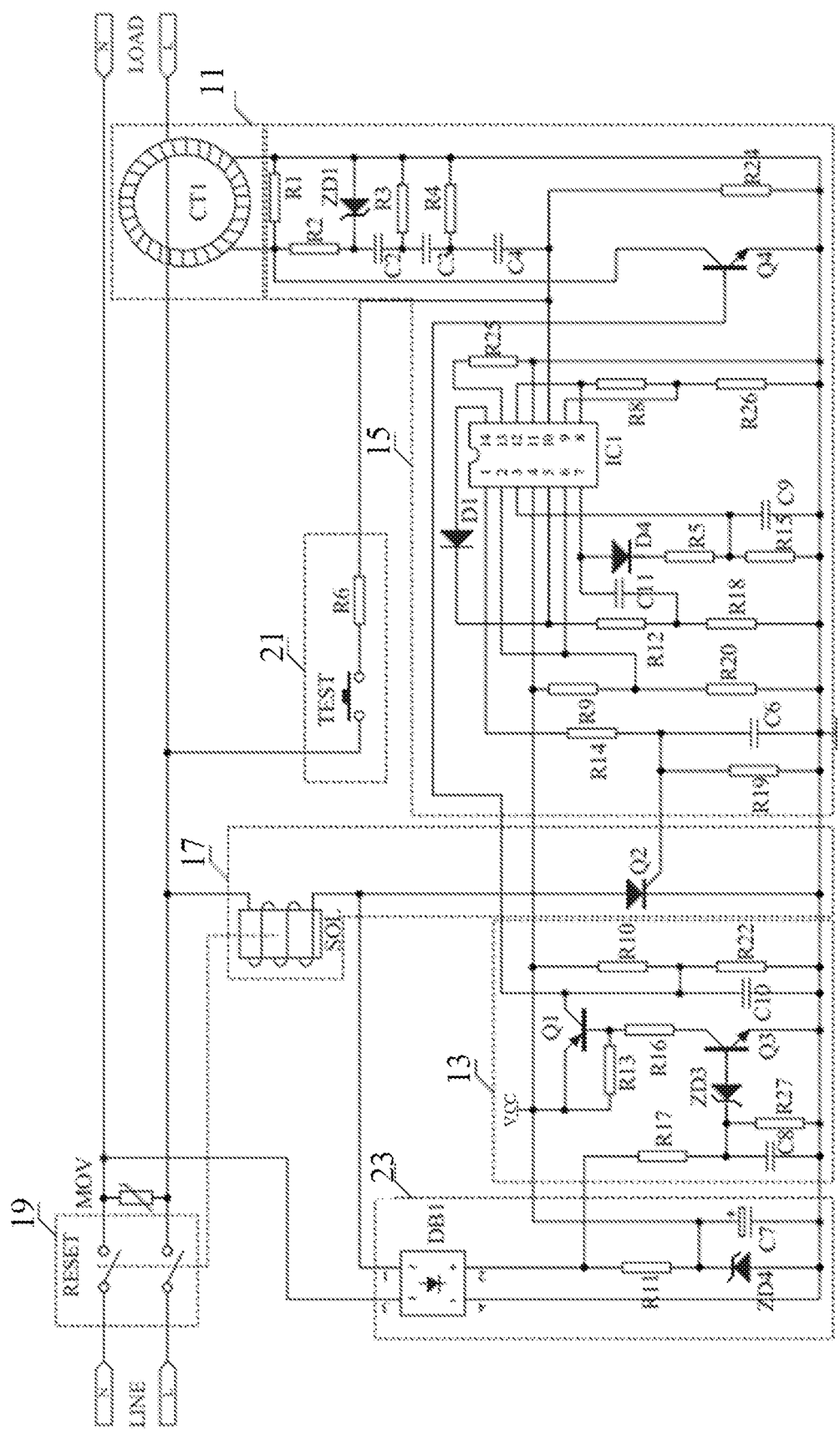
FIG. 3 is a circuit diagram illustrating the arc fault detection circuit according to another embodiment of the present invention.

FIG. 3 is a circuit diagram illustrating the arc fault detection circuit according to another embodiment of the present invention. In the circuit of FIG. 3, the switch circuit 19 is provided on the power source side (the input side of the power supply lines); while in the circuit of FIG. 2, the switch circuit 19 is provided on the load side (the output side of the power supply lines). The examples of FIGS. 2 and 3 show that the location of the protection action of the arc fault detection circuit may be adjusted based on practical need, and is not limited to the illustrated examples. In FIG. 3, the coupling between the window gating circuit 13 and the signal processing circuit 15 is different from that of FIG. 2. The examples of FIGS. 2 and 3 illustrate that the window gating circuit may operate to block relevant signals during predefined time intervals at one or more processing stages of the signal processing. The ways of coupling between the window gating circuit 13 and the signal processing circuit 15 and signal collection circuit 11 may be changed based on practical need, and are not limited to those shown in FIGS. 2 and 3.

As shown in FIG. 3, in some embodiments, the third terminal of the second transistor Q1, i.e., the output of the gating sub-circuit, is coupled to a fourth transistor Q4 which is coupled in parallel to the secondary winding of the current transformer CT1 of the signal collection circuit 11. I.e., a first terminal of the fourth transistor Q4 (e.g. the base of a bipolar transistor) is coupled to the third terminal of the second transistor Q1, a second terminal of the fourth transistor Q4 (e.g. the emitter of the bipolar transistor) is coupled to ground, and a third terminal of the fourth transistor Q4 (e.g. the collector of the bipolar transistor) is coupled to the output of the current transformer CT1.

Figure 4:
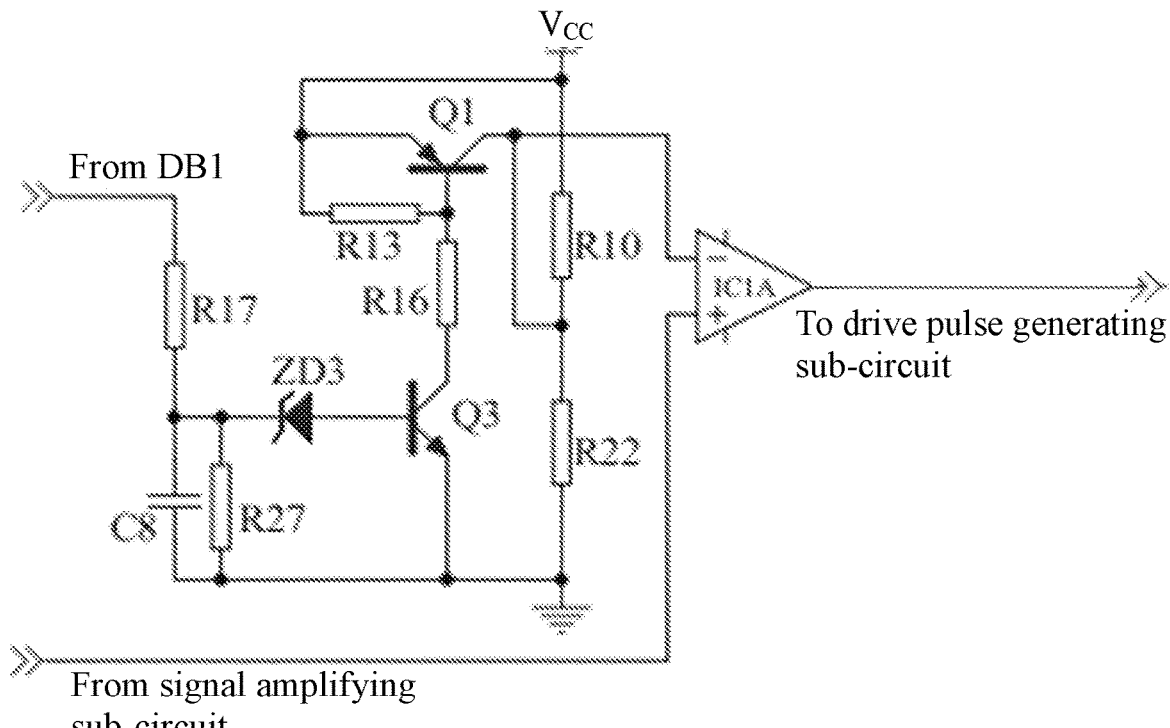
FIG. 4 is a circuit diagram illustrating a window gate circuit according to an embodiment of the present invention.
Figure 5:
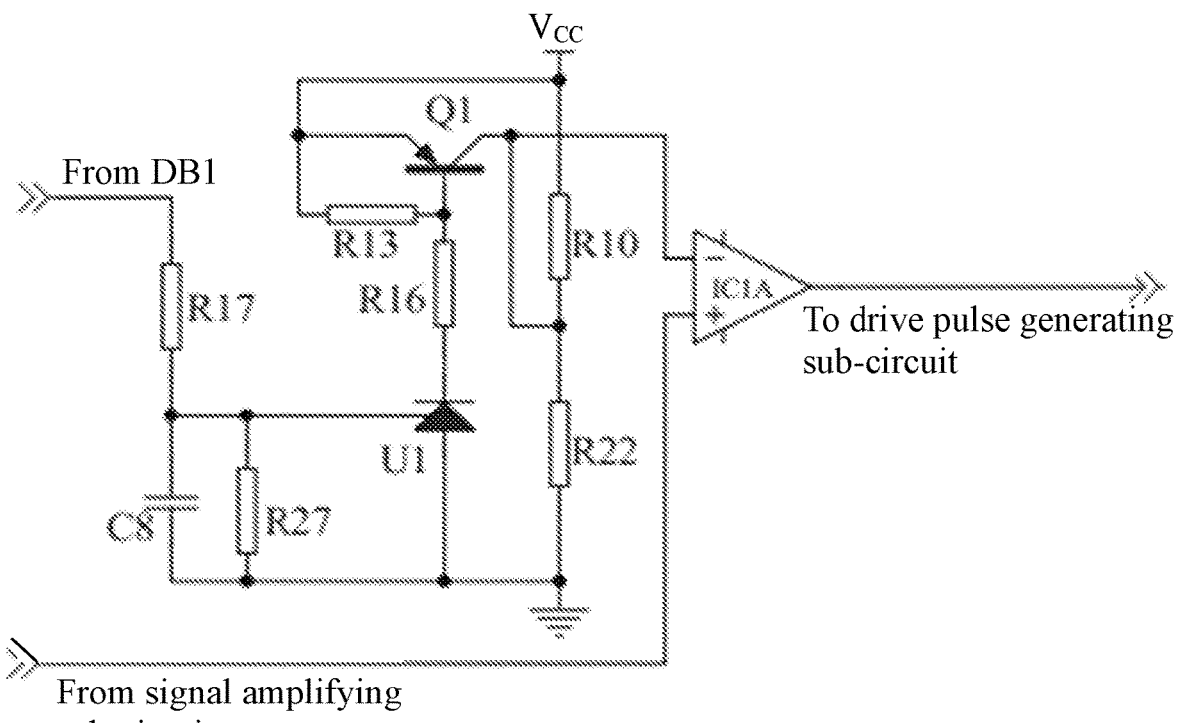
FIG. 5 is a circuit diagram illustrating a window gate circuit according to another embodiment of the present invention.
Figure 6:
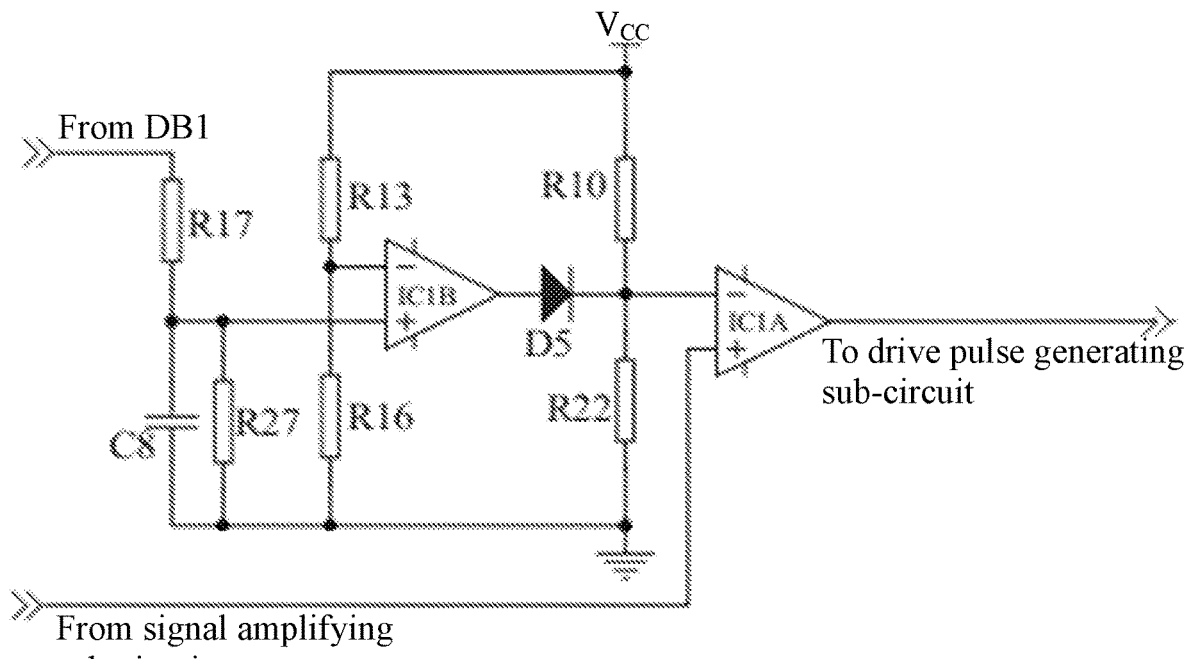
FIG. 6 is a circuit diagram illustrating a window gate circuit according to another embodiment of the present invention.

FIGS. 4, 5 and 6 are circuit diagrams respectively illustrating different implementations of the window gating circuit 13. It should be noted that while FIGS. 4-6 show exemplary circuits where the window gating circuit 13 performs gating processing of the signal from the signal amplifying sub-circuit 151 and outputs the processed signal to the drive pulse generating sub-circuit 155, the window gating circuit 13 in this invention is not limited to processing the output of the signal amplifying sub-circuit 151; it may perform gating processing of output signals of the signal collection circuit 11, the filtering sub-circuit 150, the characteristics extraction sub-circuit 153, or the drive pulse generating sub-circuit 155.

As shown in FIG. 4, the window gating signal output by the window gating circuit 13 is input into the inverting input terminal (−) of a comparator IC1A (e.g., the processing chip IC1 shown in FIG. 2) of the characteristics extraction sub-circuit 153, and the second signal output by the signal amplifying sub-circuit 151 is input into the non-inverting input terminal (+) of the comparator IC1A. The first voltage divider circuit R17 and R27 receives the rectified voltage output by the rectifier DB1 which rectifies the AC current from the power supply lines. The operating principle of this circuit is as follows.

When the inverting input terminal of the comparator IC1A is at a high voltage level, it prevents the second signal output by the signal amplifying sub-circuit 151 from being output to the next stage (i.e., this corresponds to the blocked time interval); when the inverting input terminal of the comparator IC1A is at a low voltage level, it allows the second signal output by the signal amplifying sub-circuit 151 to be output to the next stage (i.e., this corresponds to the non-blocked time interval). More specifically, as the rectified current is voltage-divided by resistors R17 and R27, the voltage at resistor R27 varies lineally with the voltage of the power supply lines; when the voltage at resistor R27 exceeds a preset value (which is determined by parameters of transistor Q3 and Zener diode ZD3), it triggers the first transistor Q3 via Zener diode ZD3 so the first transistor Q3 becomes conductive, which in turn triggers the second transistor Q1 to be conductive. As a result, the voltage at the inverting terminal of the comparator IC1A rises to near the operating voltage of the comparator IC1A (Vcc), so the voltage signal from the signal amplifying sub-circuit 151 (at the non-inverting terminal) cannot pass through the comparator IC1A (i.e., this results in the blocked time interval). Conversely, when the voltage at resistor R27 is below the preset value, the first transistor Q3 is non-conductive, which in turn causes the second transistor Q1 to be non-conductive. As a result, the voltage at the inverting terminal of the comparator IC1A is the divided voltage of the voltage divider R10 and R22 which is relatively low (i.e., this results in the non-blocked time interval). At this time, if the voltage signal from the signal amplifying sub-circuit 151 (at the non-inverting terminal) is at a sufficiently high level (higher than the divided voltage of the voltage divider R10 and R22), the comparator IC1A outputs a high voltage level.

In some embodiments, by adjusting the parameters of Zener diode ZD3 and/or resistors R17 and R27, the time intervals corresponding to the conductive state of first transistor Q3 (i.e. the blocked time intervals) can be adjusted as desired, so the window gating signal output by the window gating circuit 13 can achieve desired non-blocked time intervals for purposes of extracting a third signal from the second signal. If the power supply lines experience an arc fault, the arc fault signal will be present in the third signal. As such, extracting arc characteristics from the third signal can greatly improve the accuracy of detecting harmful arcs.

As shown in FIG. 5, in some embodiments, the gating sub-circuit may include a three-terminal adjustable voltage regulator U1, a second transistor Q1, a first protective resistor R16 and a second protective resistor R13. A first terminal of the three-terminal adjustable voltage regulator U1 is the input of the gating sub-circuit; a second terminal is coupled to ground; and a third terminal is coupled to the first terminal of the second transistor Q1 via the first protective resistor R16. The first terminal of the second transistor Q1 is coupled to a first end of the second protective resistor R13; a second end of the second protective resistor R13 is coupled to a second terminal of the second transistor Q1 and the voltage source Vcc; a third end of the second transistor Q1 is the output of the gating sub-circuit. In some embodiments, the second transistor Q1 is a PNP type bipolar transistor (its first terminal being the base, the second terminal being the emitter, and the third terminal being the collector). In some other embodiments, the second transistor Q1 may be a field-effect transistor. The operating principles of the circuit of FIG. 5 are similar to those of the circuit of FIG. 4 and further descriptions are omitted. One difference between the circuit of FIG. 5 and the circuit of FIG. 4 is that the three-terminal adjustable voltage regulator U1 in FIG. 5 replaces the Zener diode ZD3 and the first transistor Q3 in FIG. 4. This reduces the number of chip components, which in turn reduces the size of the device.

As shown in FIG. 6, in some embodiments, the gating sub-circuit may include a first comparator IC1B, first and second voltage divider resistors R13 and R16, and a diode D5. The non-inverting input terminal of the first comparator IC1B is the input of the gating sub-circuit; the inverting input terminal of the first comparator IC1B is coupled to the first and second voltage divider resistors R13 and R16; the other end of the first voltage divider resistor R13 is coupled to the voltage source Vcc; the other end of the second voltage divider resistor R16 is coupled to ground; the output terminal of the first comparator IC1B is coupled to the anode of diode D5; and the cathode of diode D5 is the output of the gating sub-circuit. The operating principles of the circuit of FIG. 6 are as follows. The voltage divider resistors R13 and R16 set the reference voltage at the inverting input terminal of the first comparator IC1B; when the voltage at the upper end of resistor R27 exceeds this reference voltage, the first comparator IC1B outputs a high voltage level. As a result, the voltage at the inverting input terminal of comparator IC1A rises to the operating voltage level, so the voltage signal from the signal amplifying sub-circuit 151 cannot pass to the output of the comparator IC1A. Conversely, when the voltage at the upper end of resistor R27 is below the reference voltage, the first comparator IC1B outputs a low voltage level. As a result, the voltage at the inverting input terminal of comparator IC1A is the relatively low voltage level produced by the voltage divider R10 and R22. At this time, if the voltage signal from the signal amplifying sub-circuit 151 (at the non-inverting terminal) is higher than the voltage level produced by the voltage divider R10 and R22, the comparator IC1A outputs a high voltage level.

In some embodiments, the arc fault drive circuit 17 includes a solenoid SOL and a silicon-controlled rectifier Q2. The output signal of the signal processing circuit 15 is coupled to the control terminal of the silicon-controlled rectifier Q2 via resistor R14, so that the arc fault signal output by the signal processing circuit 15 controls the arc fault drive circuit 17, i.e., it controls whether the silicon-controlled rectifier Q2 is conductive. When the silicon-controlled rectifier Q2 is conductive, the switch circuit 19 will turn off the power connection. More specifically, the solenoid SOL will have a relatively large current flowing through it, causing it to generate a magnetic force, and the iron core of the solenoid will move to open the switch circuit 19.

In some embodiment, the power supply circuit 23 includes a rectifier DB1, a resistor R11, a voltage regulator (Zener diode) ZD4 and a filtering capacitor C7. The first terminal (1) and third terminal (3) of the rectifier DB1 are respectively coupled to the hot (L) and white (N) lines of the power supply lines; the second terminal of the rectifier DB1 is coupled to the input of the window gating circuit 13 and a first end of resistor R11; a second end of resistor R11 is coupled to the cathode of Zener diode ZD4; and Zener diode ZD4 and capacitor C7 are coupled in parallel and coupled to ground.

In some embodiments, the simulated arc test circuit 21 includes a test button (TEST) and a protective resistor R6. When the user manually depresses the test button, a simulated arc signal is generated and output to the signal collection circuit 11 or signal processing circuit 15. This can test whether the arc fault detection circuit is operating normally to provide arc fault protection function.

Figure 7:
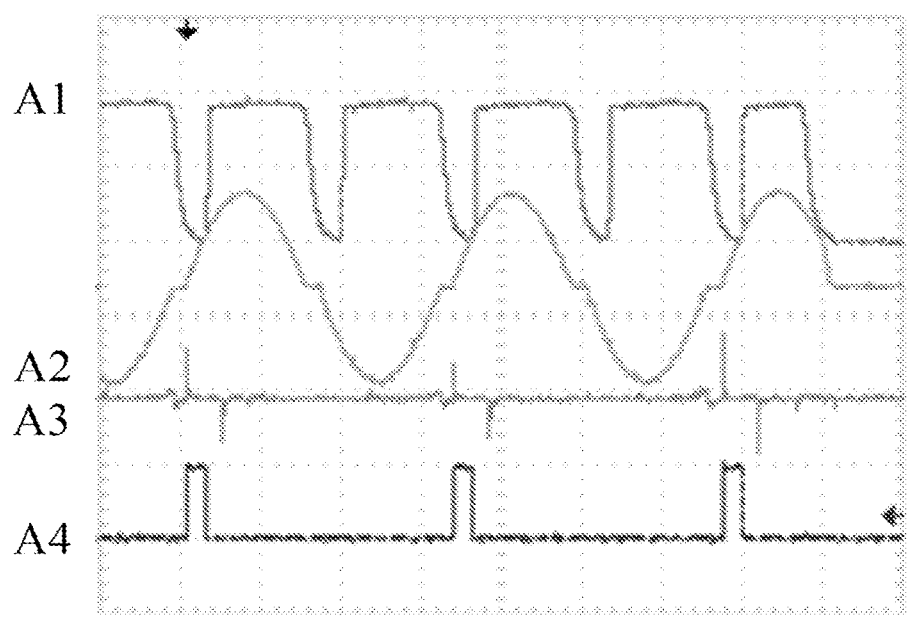
FIG. 7 shows the waveforms of various signals corresponding to a resistive load in an embodiment of the present invention.
Figure 8:
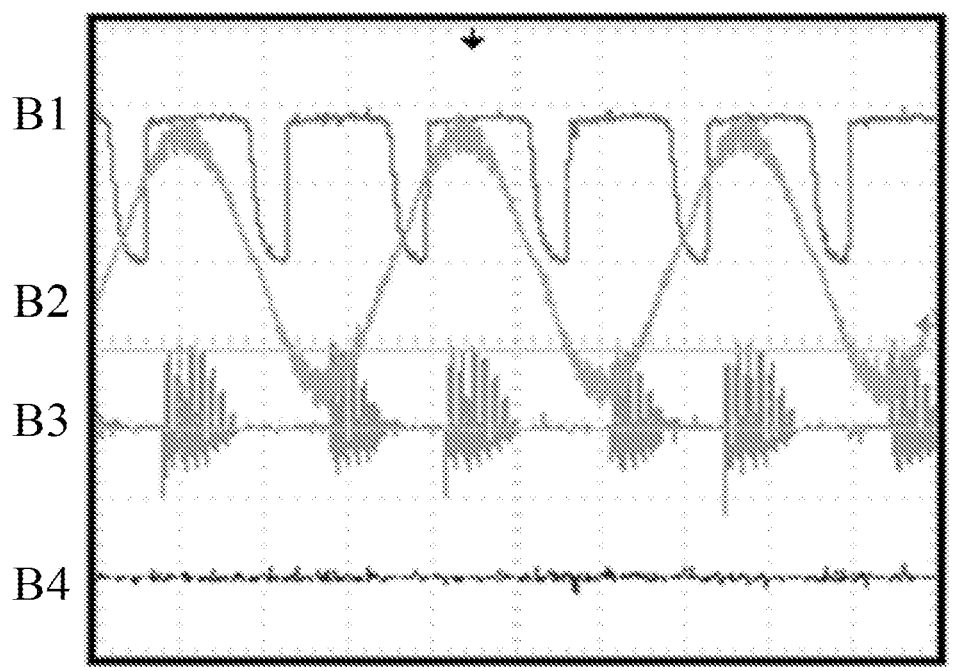
FIG. 8 shows the waveforms of various signals corresponding to an induction cooker load in an embodiment of the present invention.

FIGS. 7 and 8 show the wave forms of various signals corresponding to a resistive load and an induction cooker load, respectively, to more visually illustrate the effect of the arc fault detection circuit.

FIG. 7 illustrates a window gating signal A1, a load current signal A2, an arc characteristics signal A3, and an arc pulse signal A4 corresponding to a resistive load. As seen in FIG. 7, when the load current signal A2 crosses the zero point, a characteristic of arc ("flat shoulder") is present in time intervals corresponding to the low-voltage portion of the window gating signal A1 (i.e. the non-blocked time interval). A corresponding characteristic wave form appears in the arc characteristics signal A3, and a corresponding arc pulse appears in the arc pulse signal A4. This way, the arc fault detection circuit extracts arc characteristics present in the arc characteristics signal A3 based on the window gating signal A1, and further determines whether an arc fault occurred based on the arc pulses. The use of the window gating signal narrows the time intervals being processed, and improves the accuracy of the determination.

FIG. 8 illustrates a window gating signal B1, a load current signal B2, an arc characteristics signal B3, and an arc pulse signal B4 corresponding to an induction cooker load. As seen in FIG. 8, a high frequency signal is clearly present in the load current signal B2 near the peaks, and its frequency range overlaps the frequency range of arc signals. A corresponding characteristic wave form appears in the arc characteristics signal B3. But because the characteristic wave form is located in the high-voltage portion of the window gating signal B1 (the blocked time interval), it is blocked and does not appear in the arc pulse signal B4. This prevents false tripping due to the high frequency signal.

Figure 9:
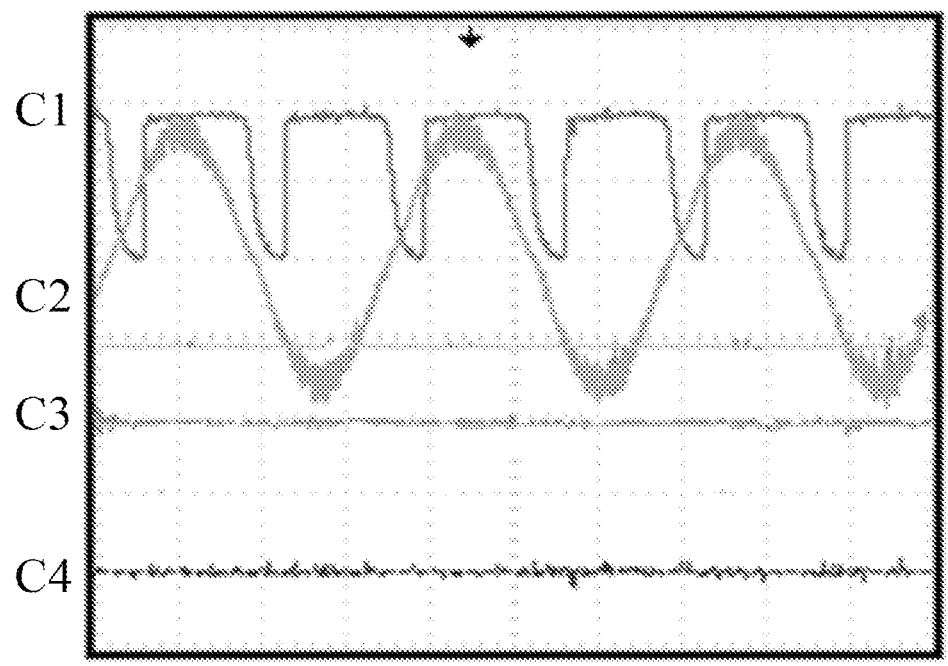
FIG. 9 shows the waveforms of various signals corresponding to an induction cooker load in another embodiment of the present invention.

FIG. 9 illustrates the wave forms of various signals in the embodiment of FIG. 2 where the load is an induction cooker load, including a window gating signal C1, a load current signal C2, an arc characteristics signal C3, and an arc pulse signal C4. As seen in FIG. 9, a high frequency signal is clearly present in the load current signal C2 near the peaks, and its frequency range overlaps the frequency range of arc signals. But because the characteristic wave form is located in the high-voltage portion of the window gating signal C1 (the blocked time interval), it is blocked and does not appear in the arc characteristics signal C3 or the arc pulse signal C4. This prevents false tripping due to the high frequency signal.

Embodiments of the present invention are described above. It will be apparent to those skilled in the art that various modifications may be made without departing from the spirit or scope of the invention. While the operation principles of the various embodiments are described, various structures, arrangements, proportions, devices, materials and components may be modified to adapt to particular environments or application requirements without departing from the spirit or scope of the invention. Such modifications of other modifications are within the scope of the present invention. Thus, the above descriptions do not limit the scope of the invention. While the advantages of various embodiments and the solutions to various technical problems are described, the advantages and solutions and any considerations that lead to these advantages or solutions, or other variations of solutions may not be critical, necessarily or inherent. Terms such as "include" or variations of such terms used in the above disclosure should be interpreted as being non-exclusive. The process, method, article of manufacture or apparatus that includes any listed elements may include not only these elements, but other elements not specifically listed or outside of these process, method, article of manufacture or apparatus. Further, terms such as "couple" or variations of such terms used in the above disclosure should be interpreted to include physical coupling, electrical coupling, magnetic coupling, optical coupling, communicative coupling, functional coupling and/or any other form of coupling.

It will be apparent to those skilled in the art that various modifications may be made to the above described embodiments without departing from the spirit or scope of the invention. Thus, it is intended that the scope of the invention is defined by the appended claims.

The invention claimed is:

1. An arc fault detection circuit, comprising:
power supply lines having an input end and an output end;
a signal collection circuit, configured to collect a current signal on the power supply lines and to output a first signal;
a window gating circuit, configured to generate a window gating signal corresponding to the first signal, wherein the window gating signal is at a first voltage level during one or more first time intervals within each period of a plurality of consecutive periods of an AC (alternating current) signal on the power supply lines, and at a second voltage level during remaining time intervals of each period of the plurality of consecutive periods of the AC signal; and
a signal processing circuit, coupled to the signal collection circuit and the window gating circuit, configured to generate an arc fault signal in response to the window gating signal and the first signal,
wherein the signal processing circuit is configured to block the first signal during the one or more first time intervals of each period and to generate the arc fault signal based on the first signal during the remaining time intervals of each period.

2. The circuit of claim 1, wherein the signal processing circuit includes a characteristics extraction sub-circuit, configured to extract arc characteristics from the first signal to generate an arc characteristics signal.

3. The circuit of claim 2, wherein the signal processing circuit further includes a drive pulse generating sub-circuit, coupled to the characteristics extraction sub-circuit, configured to generate an arc pulse signal based on the arc characteristics signal.

4. The circuit of claim 3, wherein the signal processing circuit further includes a pulse counting sub-circuit, coupled to the drive pulse generating sub-circuit, configured to count a number of pulses in the arc pulse signal and to generate the arc fault signal based on the number of pulses within a defined length of time.

5. The circuit of claim 1, wherein the signal processing circuit includes:
a signal amplifying sub-circuit, configured to amplify the first signal to generate a second signal; and
a characteristics extraction sub-circuit, coupled to the signal amplifying sub-circuit, configured to extract arc characteristics from the second signal to generate an arc characteristics signal.

6. The circuit of claim 5, wherein the signal processing circuit further includes a drive pulse generating sub-circuit, coupled to the characteristics extraction sub-circuit, configured to generate an arc pulse signal based on the arc characteristics signal.

7. The circuit of claim 6, wherein the signal processing circuit further includes a pulse counting sub-circuit, coupled to the drive pulse generating sub-circuit, configured to count a number of pulses in the arc pulse signal and to generate the arc fault signal based on the number of pulses within a defined length of time.

8. The circuit of claim 1, wherein the window gating circuit includes:
a first voltage divider sub-circuit, coupled to the power supply lines, configured to divide a voltage on the power supply lines to generate a first voltage signal;
a second voltage divider sub-circuit, coupled to the power supply lines, configured to divide the voltage on the power supply lines to generate a second voltage signal; and
a gating sub-circuit, having an input coupled to the first voltage generated by the first voltage divider sub-circuit, and an output coupled to the second voltage generated by the second voltage divider sub-circuit, wherein the gating sub-circuit is configured to become conductive in response to the first voltage at its input being within a predefined range, and to be non-conductive otherwise, to generate the window gating signal.

9. The circuit of claim 8, wherein the gating sub-circuit includes a first voltage regulator, a first transistor, a second transistor, a first protection resistor and a second protection resistor, wherein a first end of the first voltage regulator is an input of the gating sub-circuit, a second end of the first voltage regulator is coupled to a first terminal of the first transistor, a second terminal of the first transistor is coupled to ground, a third terminal of the first transistor is coupled to a first terminal of the second transistor via the first protective resistor, a first terminal of the second transistor is coupled to a first end of the second protective resistor, a second end of the second protective resistor is coupled to a second terminal of the second transistor and to a voltage source, and a third terminal of the second transistor is an output of the gating sub-circuit.

10. The circuit of claim 8, wherein the gating sub-circuit includes a three-terminal adjustable voltage regulator, a second transistor, a first protective resistor and a second protective resistor, wherein a first terminal of the three-terminal adjustable voltage regulator is an input of the gating sub-circuit, a second terminal of the three-terminal adjustable voltage regulator is coupled to ground, a third terminal of the three-terminal adjustable voltage regulator is coupled to a first terminal of the second transistor via the first protective resistor, the first terminal of the second transistor is coupled to a first end of the second protective resistor, a second end of the second protective resistor is coupled to a second terminal of the second transistor and a voltage source, and a third end of the second transistor is an output of the gating sub-circuit.

11. The circuit of claim 8, wherein the gating sub-circuit includes a first comparator, a first voltage divider resistor, a second voltage divider resistor, and a diode, wherein a non-inverting input terminal of the first comparator is an input of the gating sub-circuit, an inverting input terminal of the first comparator is coupled to the first voltage divider resistor and the second voltage divider resistor, another end of the first voltage divider resistor is coupled to a voltage source, another end of the second voltage divider resistor is coupled to ground, an output terminal of the first comparator is coupled to an anode of the diode, and a cathode of the diode is an output of the gating sub-circuit.

12. The circuit of claim 1, further comprising:
an arc fault drive circuit, coupled to the signal processing circuit, configured to generate a switch control signal based on the arc fault signal; and
a switch circuit, couple to the arc fault drive circuit, configured to open or close an on/off switch on the power supply lines based on the switch control signal.

13. The circuit of claim 12, further comprising a simulated arc test circuit, having an output coupled to the signal collection circuit or the signal processing circuit, configured to generate a simulated arc fault signal, wherein the signal processing circuit processes the simulated arc fault signal to generate an arc fault signal, whereby the switch circuit opens the on/off switch on the power supply line in response to the simulated arc fault signal.

14. The circuit of claim 12, further comprising a power supply circuit, which includes a rectifier configured to convert an AC current from the power supply line to a DC current, and a second voltage regulator configured to generate a stable DC voltage to supply the window gating circuit and the signal processing circuit.

15. The circuit of claim 1, wherein the signal processing circuit further includes a filtering sub-circuit, coupled to the signal collection circuit, configured to filter the first signal.

16. The circuit of claim 1, wherein the signal processing circuit includes a filtering sub-circuit, a characteristics extraction sub-circuit, and a drive pulse generating sub-circuit, wherein the window gating circuit is electrically coupled to at least one of the signal collection circuit, the filtering sub-circuit, the characteristics extraction sub-circuit, and the drive pulse generating sub-circuit, configured to block the output signal of the signal collection circuit, the filtering sub-circuit, the characteristics extraction sub-circuit, or the drive pulse generating sub-circuit during the one or more first time intervals.

* * * * *